US009564182B2

(12) United States Patent
Koike et al.

(10) Patent No.: US 9,564,182 B2
(45) Date of Patent: Feb. 7, 2017

(54) SEMICONDUCTOR STORAGE DEVICE AND SENSE AMPLIFIER CIRCUIT

(71) Applicant: SOCIONEXT INC., Yokohama-shi, Kanagawa (JP)

(72) Inventors: Tsuyoshi Koike, Shiga (JP); Yoshinobu Yamagami, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/064,381

(22) Filed: Mar. 8, 2016

(65) Prior Publication Data

US 2016/0189756 A1    Jun. 30, 2016

Related U.S. Application Data

(63) Continuation of application No. PCT/JP2014/002302, filed on Apr. 24, 2014.

(30) Foreign Application Priority Data

Sep. 9, 2013  (JP) .................. 2013-186261

(51) Int. Cl.
*G11C 7/02*      (2006.01)
*G11C 7/06*      (2006.01)
(Continued)

(52) U.S. Cl.
CPC ............. *G11C 7/062* (2013.01); *G11C 5/148* (2013.01); *G11C 11/419* (2013.01);
(Continued)

(58) Field of Classification Search
CPC ....................................... G11C 7/02

USPC ....................... 365/189.011–225.7
See application file for complete search history.

(56) References Cited

U.S. PATENT DOCUMENTS 8,169,814 B2 * 5/2012 Chuang ................ G11C 11/412
365/154
2006/0262635 A1    11/2006 Kanehara
(Continued)

FOREIGN PATENT DOCUMENTS

| JP | 58-102390 A | 6/1983 |
| JP | 2002-093174 A | 3/2002 |
| JP | 2006-323950 A | 11/2006 |
| JP | 2011-248971 A | 12/2011 |

OTHER PUBLICATIONS

International Search Report issued in Application No. PCT/JP2014/002302 dated Jul. 15, 2014, with English translation.
(Continued)

*Primary Examiner* — Harry W Byrne
(74) *Attorney, Agent, or Firm* — McDermott Will & Emery LLP

(57) ABSTRACT

A cross-coupled circuit provided between first and second bit lines that form a bit line pair includes first to fourth fin transistors of p-channel type. The first transistor has its source connected to a first power supply and its gate connected to the second bit line. The second transistor has its source connected to the first power supply and its gate connected to the first bit line. The third transistor has its source connected to the first transistor's drain and its drain connected to the first bit line. The fourth transistor has its source connected to the second transistor's drain and its drain connected to the second bit line.

16 Claims, 8 Drawing Sheets

(51) Int. Cl.
*G11C 11/419* (2006.01)
*H01L 27/11* (2006.01)
*G11C 5/14* (2006.01)
*H01L 27/105* (2006.01)
*G11C 7/12* (2006.01)
*H01L 29/78* (2006.01)

(52) U.S. Cl.
CPC ........ *H01L 27/105* (2013.01); *H01L 27/1104* (2013.01); *H01L 27/1116* (2013.01); *G11C 7/065* (2013.01); *G11C 7/12* (2013.01); *H01L 29/785* (2013.01)

(56) References Cited

U.S. PATENT DOCUMENTS

| | | |
|---|---|---|
| 2011/0292709 A1 | 12/2011 | Takayama et al. |
| 2012/0014171 A1* | 1/2012 | Chuang ................. G11C 11/412 365/154 |
| 2012/0092072 A1 | 4/2012 | Upputuri et al. |
| 2013/0100731 A1* | 4/2013 | Chuang ................. G11C 11/412 365/154 |
| 2013/0141962 A1* | 6/2013 | Liaw .................... G11C 11/412 365/154 |

OTHER PUBLICATIONS

Written Opinion issued in Application No. PCT/JP2014/002302 dated Jul. 15, 2014, with partial English translation.

\* cited by examiner

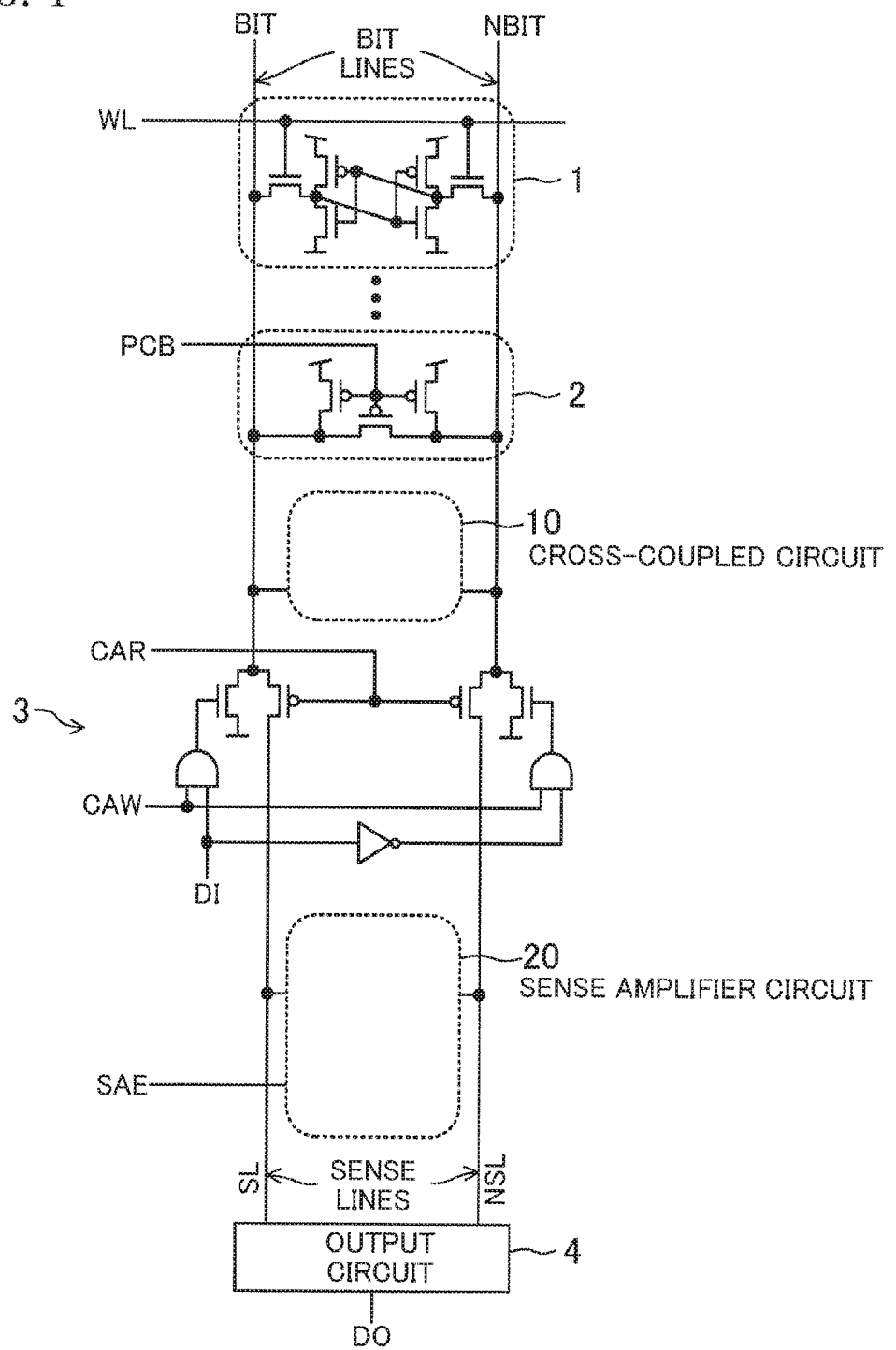

SEMICONDUCTOR STORAGE DEVICE AND SENSE AMPLIFIER CIRCUIT

CROSS-REFERENCE TO RELATED APPLICATION

This is a continuation of International Application No. PCT/JP2014/002302 filed on Apr. 24, 2014, which claims priority to Japanese Patent Application No. 2013-186261 filed on Sep. 9, 2013. The entire disclosures of these applications are hereby incorporated by reference.

BACKGROUND

The present disclosure relates to a semiconductor storage device with a transistor having a fin structure.

Recently, it has been proposed to utilize transistors with a fin structure (hereinafter referred to as a "fin transistor") in the field of semiconductor devices. FIG. 7 schematically illustrates a fin transistor. Unlike a metal oxide semiconductor (MOS) transistor having a two-dimensional structure, its source and drain have a raised, three-dimensional structure called "fin." Its gate is disposed so as to wrap around a channel region defined between the source and drain in this fin.

In this fin structure, the channel region is defined by three surfaces of the fin, thereby improving channel controllability significantly compared to conventional ones. As a result, various advantages, including reducing the leakage power, increasing the ON-state current, and lowering the operating voltage, are achieved. This leads to improving the performance of the semiconductor integrated circuit.

Japanese Unexamined Patent Publication No. 2006-323950 discloses a semiconductor storage device in which a cross-coupled circuit is provided between two bit lines that form a bit line pair. Japanese Unexamined Patent Publication No. 2002-93174 discloses an example of a sense amplifier circuit provided in a memory.

SUMMARY

A fin transistor would have a greater coupling capacitance between its gate and doped regions than a planar transistor. Specifically, as shown in FIG. 7, since the fin transistor has a structure in which the gate wraps around a portion of the fin, portions A1 and A2 of the gate will produce an extra capacitance, which is absent from a planar transistor, between the gate and the doped regions. Therefore, the coupling capacitance between, e.g., the gate and drain of a fin transistor is greater than that of a planar transistor.

On the other hand, in a semiconductor storage device, when a read operation is performed, for example, a sense amplifier circuit amplifies a slight potential difference produced between two bit lines (sense lines). Here, the sense amplifier circuit is supposed to include a transistor, of which the gate is connected to one of the two bit lines and the drain is connected to the other bit line. If this transistor is configured as a fin transistor, the gate-drain coupling capacitance increases compared to a situation where the transistor is configured as a planar transistor. Thus, there will be better chances of charging and discharging of one bit line affecting the other bit line by generating noise. This increases the frequency of occurrence of data read errors. Likewise, during a write operation, the use of the fin transistor also increases the frequency of occurrence of data write errors. For these reasons, to use a fin transistor in a semiconductor storage device, it is particularly important to take measures against the interference between the bit lines.

It is therefore an object of the present disclosure to reduce the occurrence of read and write errors in a semiconductor storage device including a fin transistor by adopting a circuit configuration configured to lessen the influence of a coupling capacitance.

According to an aspect of the present disclosure, a semiconductor storage device includes: a bit line pair comprised of a first bit line and a second bit line; and a cross-coupled circuit provided between the first bit line and the second bit line. The cross-coupled circuit includes first, second, third, and fourth transistors configured as fin transistors of p-channel type. The first transistor has a source connected to a first power supply and a gate connected to the second bit line. The second transistor has a source connected to the first power supply and a gate connected to the first bit line. The third transistor has a source connected to the first transistor's drain and a drain connected to the first bit line. The fourth transistor has a source connected to the second transistor's drain and a drain connected to the second bit line.

According to this aspect, the third transistor is provided between the first bit line and the drain of the first transistor, of which the gate is connected to the second bit line. The fourth transistor is provided between the second bit line and the drain of the second transistor, of which the gate is connected to the first bit line. In other words, each transistor of which the gate is connected to one of the two bit lines has its drain indirectly connected to the other bit line via another transistor. This allows for preventing the coupling capacitance between the gate and drain of the fin transistor from affecting the bit line pair, thereby reducing significantly the occurrence of data read and write errors.

Another aspect of the present disclosure provides a sense amplifier circuit provided between a first sense line and a second sense line that form a sense line pair. The sense amplifier circuit includes first, second, third, and fourth transistors which are fin transistors of p-channel type. The first transistor has a source connected to a first power supply and a gate connected to the second sense line. The second transistor has a source connected to the first power supply and a gate connected to the first sense line. The third transistor has a source connected to the first transistor's drain and a drain connected to the first sense line. The fourth transistor has a source connected to the second transistor's drain and a drain connected to the second sense line.

According to this aspect, the third transistor is provided between the first sense line and the drain of the first transistor, of which the gate is connected to the second sense line. The fourth transistor is provided between the second sense line and the drain of the second transistor, of which the gate is connected to the first sense line. In other words, each transistor of which the gate is connected to one of the two sense lines has its drain indirectly connected to the other sense line via another transistor. This allows for preventing the coupling capacitance between the gate and drain of the fin transistor from affecting the sense line pair, thereby reducing significantly the occurrence of data read and write errors.

The present disclosure allows for preventing, in a semiconductor storage device including a fin transistor, the coupling capacitance between the gate and drain of the fin transistor from affecting a bit line pair or a sense line pair, thereby reducing significantly the occurrence of data read and write errors.

BRIEF DESCRIPTION OF THE DRAWINGS

FIG. 1 is a circuit diagram showing an exemplary configuration for a semiconductor storage device.

FIGS. 2A and 2B show an exemplary cross-coupled circuit according an embodiment, wherein FIG. 2A is a circuit diagram, and FIG. 2B is a plan view illustrating a layout design thereof.

FIGS. 3A and 3B show another exemplary cross-coupled circuit according to an embodiment, wherein FIG. 3A is a circuit diagram, and FIG. 3B is a plan view illustrating a layout design thereof.

FIGS. 4A and 4B show an exemplary sense amplifier circuit according to an embodiment, wherein FIG. 4A is a circuit diagram, and FIG. 4B is a plan view illustrating a layout design thereof.

FIGS. 5A and 5B show another exemplary sense amplifier circuit according to an embodiment, wherein FIG. 5A is a circuit diagram, and FIG. 5B is a plan view illustrating a layout design thereof.

FIGS. 6A and 6B show yet another exemplary sense amplifier circuit according to an embodiment, wherein FIG. 6A is a circuit diagram, and FIG. 6B is a plan view illustrating a layout design thereof.

DETAILED DESCRIPTION

Figure 2A:
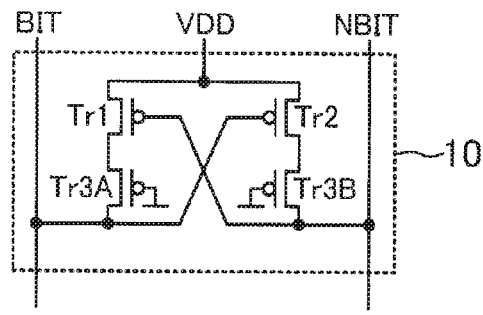

Embodiments will be described below with reference to the drawings.

FIG. 1 is a circuit diagram illustrating a portion of an exemplary configuration for an SRAM, which is an exemplary implementation of a semiconductor storage device according to the present disclosure. In FIG. 1, a memory cell 1 is connected to a word line WL and a pair of bit lines BIT and NBIT. In this example, the memory cell 1 is comprised of six transistors. However, the present disclosure is not limited to this exemplary configuration.

To the pair of bit lines BIT and NBIT, connected are a precharge circuit 2, a cross-coupled circuit 10, and a column selection circuit 3. The precharge circuit 2 receives a precharge control signal PCB, and precharges the pair of bit lines BIT and NBIT. The column selection circuit 3 electrically connects the pair of bit lines BIT and NBIT to a pair of sense lines SL and NSL, in response to a read column selection signal CAR indicating that read has been selected. On the other hand, the column selection circuit 3 provides the pair of bit lines BIT and NBIT with given write data DI in response to a write column selection signal CAW indicating that write has been selected. The cross-coupled circuit 10 is provided to ensure that one of the pair of bit lines BIT and NBIT goes high when the other one is low. The configuration of the cross-coupled circuit 10 will be described later.

To the pair of sense lines SL and NSL, connected are a sense amplifier circuit 20 and an output circuit 4. The sense amplifier circuit 20 amplifies a slight potential difference between the pair of sense lines SL and NSL, and causes one of the sense lines SL and NSL to go low and the other one to go high so as to enable reading of data. The configuration of the sense amplifier circuit 20 will be described later. The output circuit 4 reads data DO to be output based on the potential on the pair of sense lines SL and NSL, and outputs the data DO.

<Cross-Coupled Circuit>

Figure 2B:
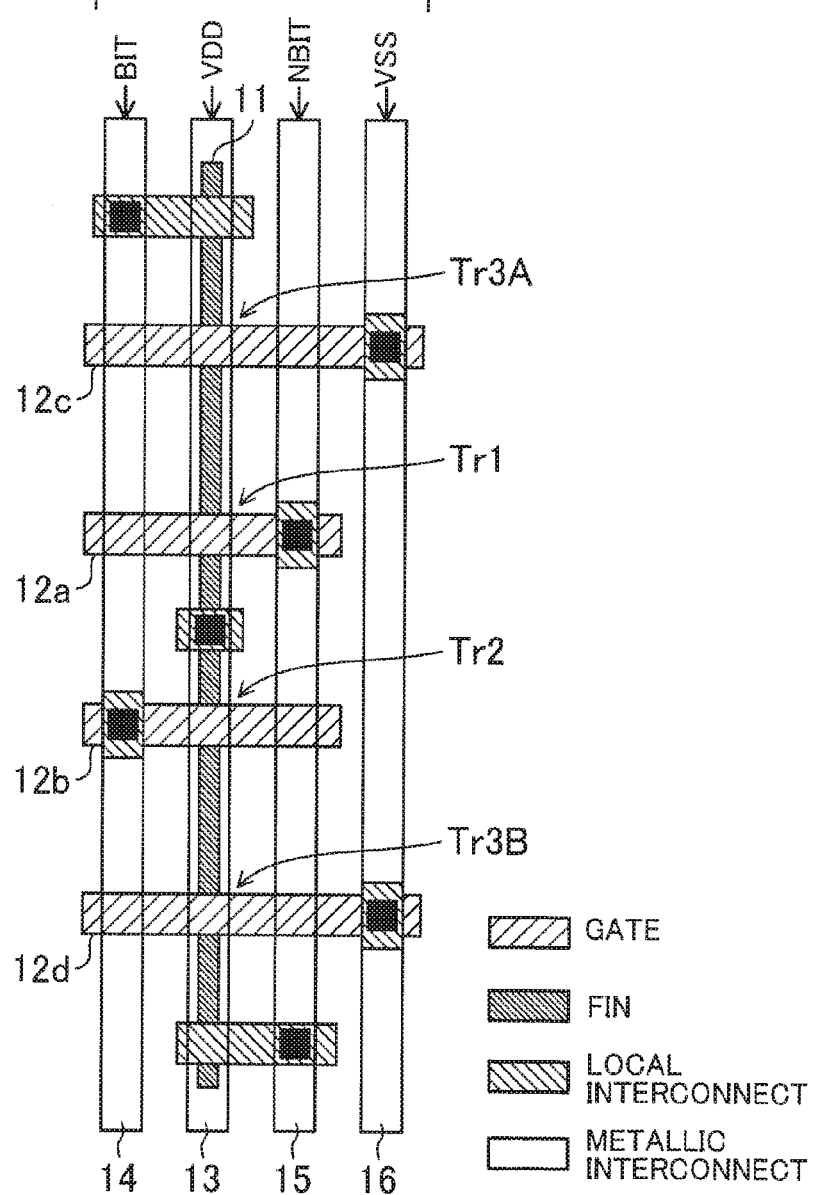

FIGS. 2A and 2B show an exemplary cross-coupled circuit 10 according to this embodiment. Specifically, FIG. 2A is a circuit diagram, and FIG. 2B is a plan view illustrating a layout design thereof. In FIGS. 2A and 2B, transistors Tr1, Tr2, Tr3A, and Tr3B are all fin transistors of p-channel type. In FIG. 2B and the other plan views attached hereto, each fin transistor is comprised of a fin and a gate formed on the fin. Local interconnects are each formed so as to be located on the fin or a gate in a region in which the local interconnect overlaps with the fin or gate when viewed in plan, and is electrically connected to the fin or gate. Metallic interconnects are located over the local interconnects, and connected to the local interconnects through contacts. In FIG. 2B, the fin is hatched to allow the reader to find the fin easily on the drawing. However, the fin is not hatched at its portion located under the gates. The gates and local interconnects are also hatched differently, and portions at which the metallic interconnects and local interconnects are connected together through contacts are indicated by the solid squares. The other plan views are illustrated in the same or similar manner.

As shown in FIG. 2A, the transistor Tr1 functioning as a first transistor has its source connected to a VDD serving as a first power supply and its gate connected to the bit line NBIT serving as a second bit line. The transistor Tr2 functioning as a second transistor has its source connected to the VDD and its gate connected to the bit line BIT serving as a first bit line. The transistor Tr3A functioning as a third transistor has its source connected to the drain of the transistor Tr1 and its drain connected to the bit line BIT. The transistor Tr3B functioning as a fourth transistor has its source connected to the drain of the transistor Tr2 and its drain connected to the bit line NBIT. Further, the gates of the transistors Tr3A and Tr3B are connected to a VSS serving as a second power supply which has a lower supply voltage than the first power supply.

As shown in FIG. 2B, in this layout design, the fin 11 is arranged to extend vertically on the paper. The gates 12a, 12b, 12c, and 12d which extend in the lateral direction on the paper are arranged in parallel with each other on and across the fin 11. The gate 12a functioning as a first gate and the fin 11 form the transistor Tr1. The gate 12b functioning as a second gate and the fin 11 form the transistor Tr2. The gate 12c functioning as a third gate and the fin 11 form the transistor Tr3A. The gate 12d functioning as a fourth gate and the fin 11 form the transistor Tr3B. The gate 12c, the gate 12a, the gate 12b, and the gate 12d are arranged in this order from the top toward the bottom of the paper. In other words, the first to fourth gates that respectively form part of the first to fourth transistors are arranged on the fin 11 in the order of the third gate, the first gate, the second gate, and the fourth gate.

A power supply line 13 for the VDD extends vertically on the paper. Bit lines 14 and 15 (BIT, NBIT) are arranged to extend in the vertical direction on the paper such that the power supply line 13 is interposed between the bit lines 14 and 15 (BIT, NBIT). Further, a power supply line 16 for the VSS is arranged to extend along the bit line 15 in the vertical direction on the paper.

Figure 8:
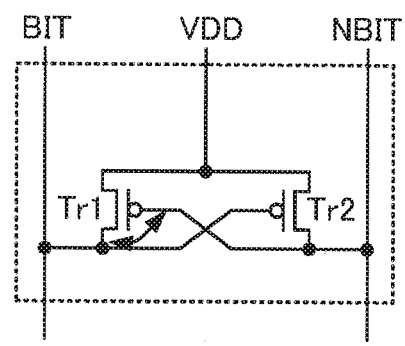
FIG. 8 shows an exemplary configuration for a conventional cross-coupled circuit.

FIG. 8 shows an exemplary conventional cross-coupled circuit. Here, the circuit of FIG. 2A is compared to the circuit of FIG. 8. In the circuit of FIG. 8, the gate of the transistor Tr1 and the drain of the transistor Tr2 are connected to the bit line NBIT, and the drain of transistor Tr1 and the gate of the transistor Tr2 are connected to the bit line BIT. On the other hand, in the circuit of FIG. 2A, the transistor Tr3A is connected in series between the transistor Tr1 and the bit line BIT, and the transistor Tr3B is connected in series between the transistor Tr2 and the bit line NBIT. That is to say, the circuit configuration of FIG. 2A does not have the structure in which the gate and drain of a single transistor are respectively connected to the bit lines BIT and NBIT. Specifically, in the circuit configuration of FIG. 2A, each of the transistors Tr1 and Tr2 has their gate connected to one of the two bit lines and their drain indirectly connected to the other bit line via another transistor Tr3A or Tr3B. This allows for preventing the coupling capacitance between the gate and drain of the fin transistor from affecting the pair of bit lines BIT and NBIT, thereby reducing significantly the occurrence of data read and write errors.

In FIGS. 2A and 2B, the gates of the transistors Tr3A and Tr3B are connected to the VSS. Alternatively, a dedicated signal that is kept low may be applied to the gates of these transistors.

Figure 3A:
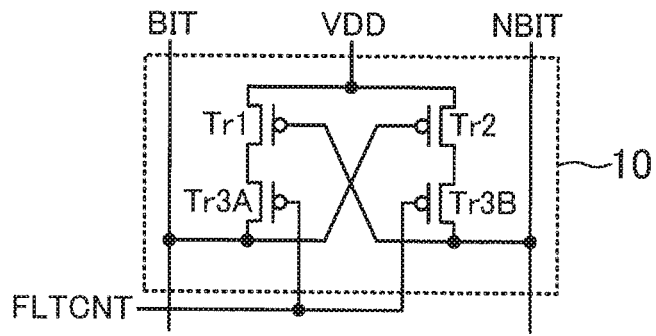
Figure 3B:
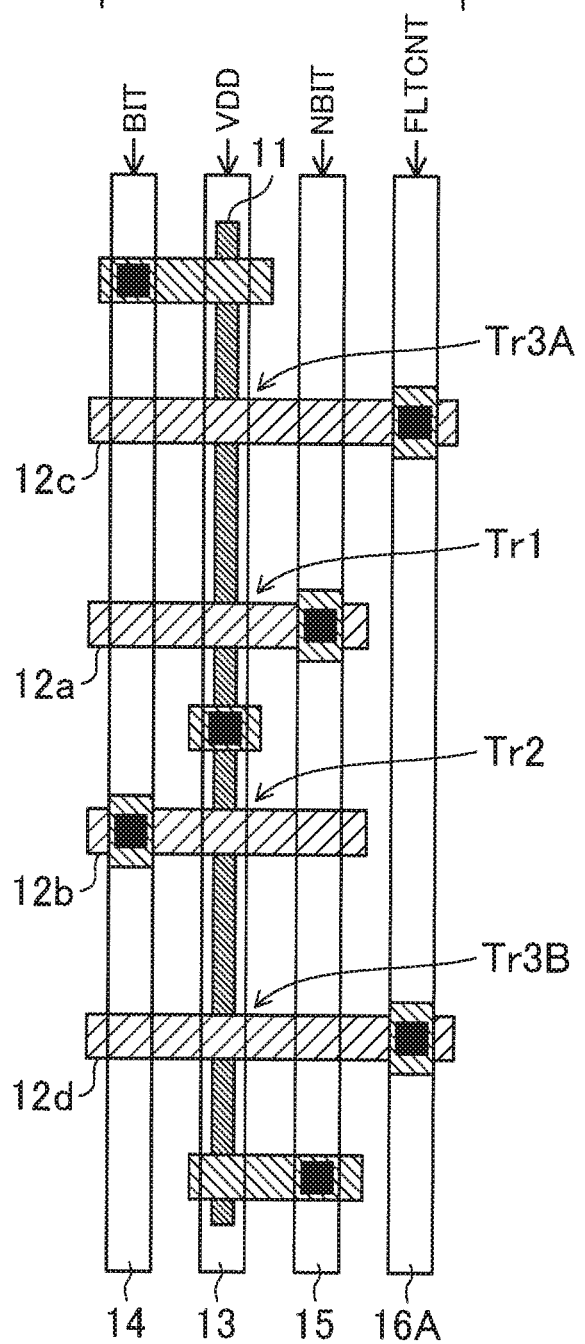

FIGS. 3A and 3B show another exemplary cross-coupled circuit 10 according to this embodiment. Specifically, FIG. 3A is a circuit diagram, and FIG. 3B is a plan view illustrating a layout design thereof. The configuration shown in FIGS. 3A and 3B is basically the same as that shown in FIGS. 2A and 2B, except that a control signal FLTCNT is applied to the gates of the transistors Tr3A and Tr3B. The control signal FLTCNT switches the transistors Tr3A and Tr3B between the ON and OFF states. For example, the control signal FLTCNT is applied in response to a signal to shut down the power supply for the memory cell 1 that is connected to the pair of bit lines BIT and NBIT. When the power supply for the memory cell 1 is shut down, the control signal FLTCNT has its voltage level set to be such a level as to turn OFF the transistors Tr3A and Tr3B. Likewise, the layout design shown in the FIG. 3B is basically the same as that shown in the FIG. 2B, except that the power supply line 16 is replaced with a line 16A through which the control signal FLTCNT is applied.

In the configuration of FIGS. 3A and 3B, the transistors Tr3A and Tr3B have the function of electrically isolating the cross-coupled circuit 10 from the pair of bit lines BIT and NBIT. In general, to turn the bit lines BIT and NBIT into a floating state when the power supply for the memory cell is down, the cross-coupled circuit needs to be electrically isolated from the pair of bit lines BIT and NBIT. According to known art, for example, a transistor for shutting down a power supply is provided for the sources of the transistors Tr1 and Tr2, and is set to be in OFF state, thereby carrying out the electrical isolation. In contrast, according to the configuration of FIGS. 3A and 3B, the transistors Tr3A and Tr3B, which are provided to reduce the influence of the coupling capacitance between the gate and drain of the fin transistor, also have the function of electrically isolating the cross-coupled circuit 10 from the pair of bit lines BIT and NBIT. This eliminates the need for providing the transistor for shutting down a power supply, and consequently, allows for reducing an increase in the circuit area.

Note that the transistors Tr3A and Tr3B may be controlled by means of the control signal FLTCNT for other purposes. For example, in a configuration in which the bit lines BIT and NBIT are used as a pair of data lines during writing, and are assigned to different ports to read data during reading, the transistors Tr3A and Tr3B may be controlled by means of the control signal FLTCNT to electrically isolate the bit lines BIT and NBIT during reading.

<Sense Amplifier Circuit>

Figure 4A:
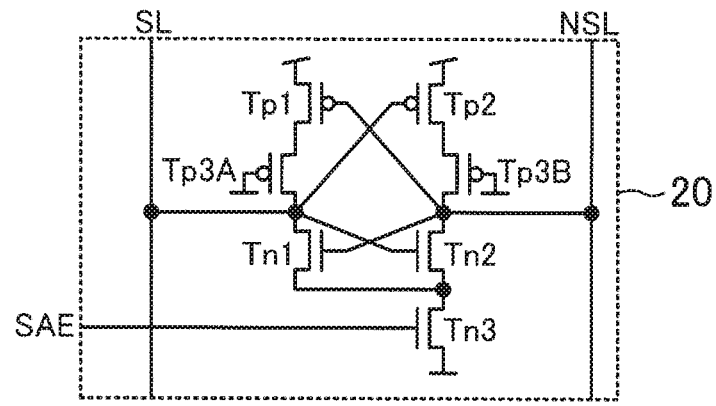
Figure 4B:
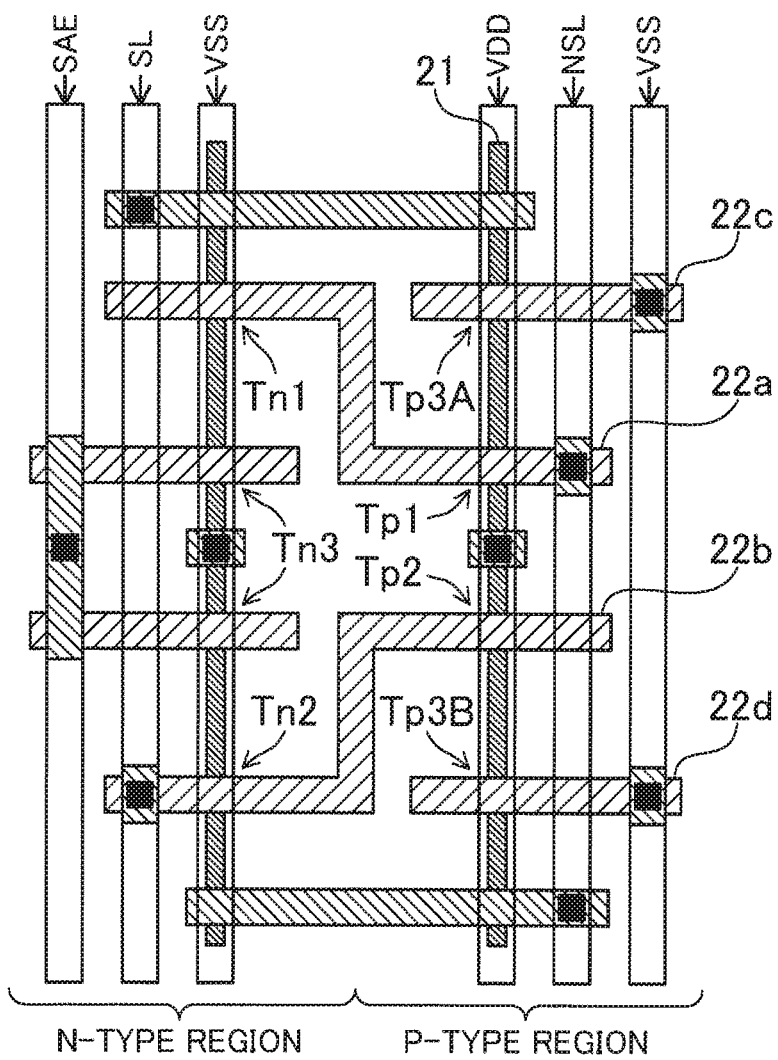

FIGS. 4A and 4B show an exemplary sense amplifier circuit 20 according to this embodiment. Specifically, FIG. 4A is a circuit diagram, and FIG. 4B is a plan view illustrating a layout design thereof. In FIG. 4, transistors Tp1, Tp2, Tp3A, and Tp3B are all fin transistors of p-channel type. Transistors Tn1, Tn2, and Tn3 are all fin transistors of n-channel type.

As shown in FIG. 4A, as for the p-channel transistors, the transistor Tp1 functioning as a first transistor has its source connected to the VDD serving as the first power supply and its gate connected to the sense line NSL serving as a second sense line. The transistor Tp2 functioning as a second transistor has its source connected to the VDD and its gate connected to the sense line SL serving as a first sense line. The transistor Tp3A functioning as a third transistor has its source connected to the drain of the transistor Tp1 and its drain connected to the sense line SL. The transistor Tp3B functioning as a fourth transistor has its source connected to the drain of the transistor Tp2 and its drain connected to the sense line NSL. Further, the gates of the transistor Tp3A and Tp3B are connected to the VSS serving as the second power supply which has a lower supply voltage than the first power supply.

On the other hand, the n-channel transistors have the same or similar configuration to the configuration of known art. The transistor Tn1 functioning as a fifth transistor has its drain connected to the sense line SL and its gate connected to the sense line NSL. The transistor Tn2 functioning as a sixth transistor has its drain connected to the sense line NSL and its gate connected to the sense line SL. The transistor Tn3 functioning as a seventh transistor has its drain connected to the sources of the transistors Tn1 and Tn2, its source connected to the VSS, and its gate supplied with a sense enable signal SAE.

As shown in FIG. 4B, in the layout design of the p-type region, a fin 21 is arranged to extend vertically on the paper. The gate 22a, 22b, 22c, and 22d which extend in the lateral direction on the paper are arranged in parallel with each other on and across the fin 21. The gate 22a functioning as a first gate and the fin 21 form the transistor Tp1. The gate 22b functioning as a second gate and the fin 21 form the transistor Tp2. The gate 22c functioning as a third gate and the fin 21 form the transistor Tp3A. The gate 22d functioning as a fourth gate and the fin 21 form the transistor Tp3B. The gate 22c, the gate 22a, the gate 22b, and the gate 22d are arranged in this order from the top toward the bottom of the paper. In other words, the first to fourth gates that respectively constitute the first to fourth transistors are arranged on the fin 21 in the order of the third gate, the first gate, the second gate, and the fourth gate.

In the configuration of FIG. 4A, like the above-described cross-coupled circuit 10, the transistor Tp3A is connected in series between the transistor Tp1 and the sense line SL, and the transistor Tp3B is connected in series between the transistor Tp2 and the sense line NSL. That is to say, the circuit configuration of this embodiment does not have the structure in which the gate and drain of a single p-channel transistor are respectively connected to the sense lines SL and NSL. Specifically, in the circuit configuration of FIG. 4A, each of the transistors Tp1 and Tp2 has their gate connected to one of the two sense lines and their drain indirectly connected to the other sense line via another transistor Tp3A or Tp3B. This allows for preventing the coupling capacitance between the gate and drain of the fin transistor from affecting the pair of sense lines SL and NSL, thereby reducing the occurrence of data read and write errors.

In FIGS. 4A and 4B, the gates of the transistors Tp3A and Tp3B are connected to the VSS. Alternatively, a dedicated signal that is kept low may be applied to the gates of these transistors.

Figure 5A:
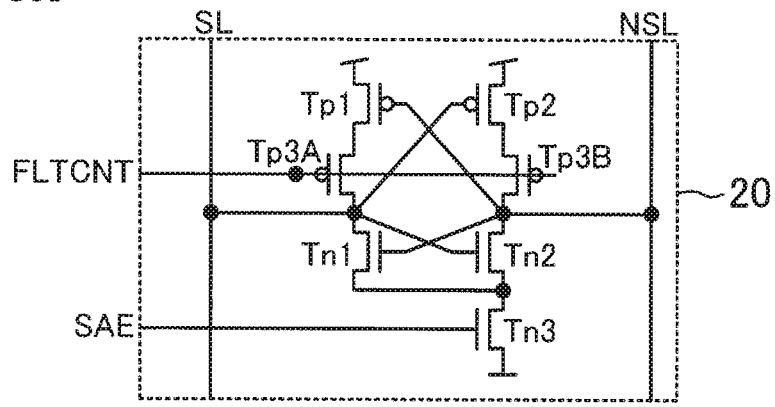
Figure 5B:
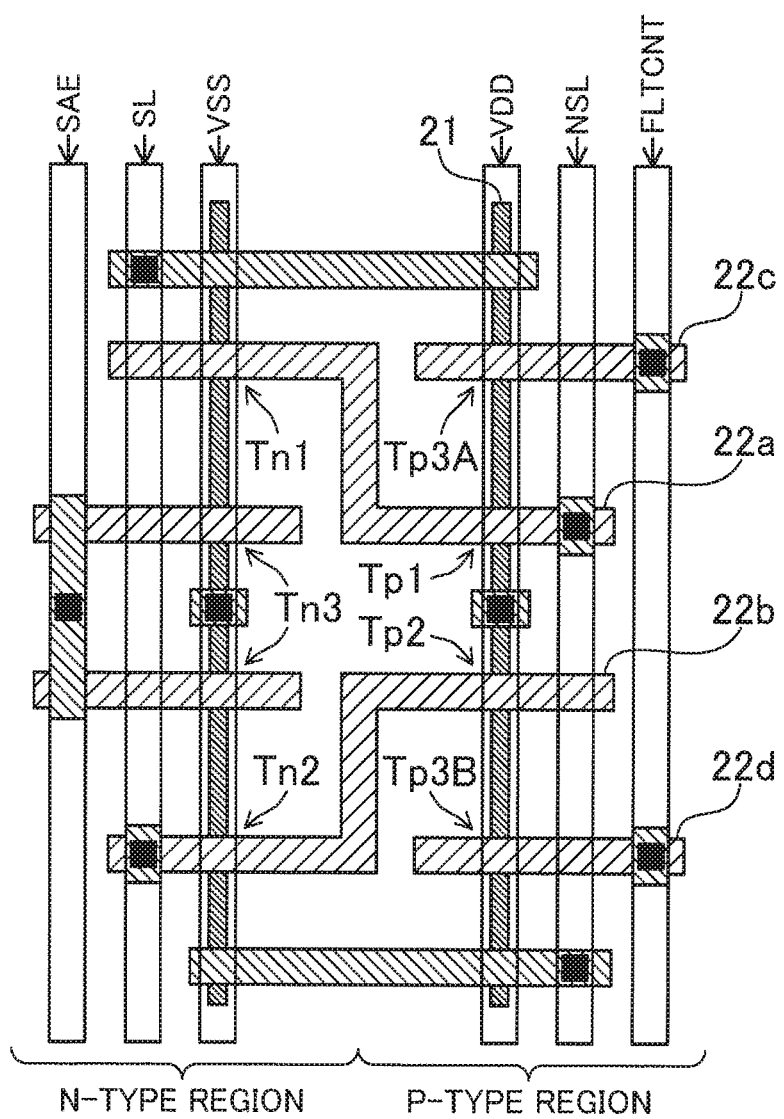

FIGS. 5A and 5B show another exemplary sense amplifier circuit 20 according to this embodiment. Specifically, FIG. 5A is a circuit diagram, and FIG. 5B is a plan view illustrating a layout design thereof. The configuration shown in FIGS. 5A and 5B is basically the same as that shown in FIGS. 4A and 4B, except that a control signal FLTCNT is applied to the gates of the transistors Tp3A and Tp3B. The control signal FLTCNT switches the transistors Tp3A and Tp3B between the ON and OFF states. For example, the control signal FLTCNT may be applied in response to a signal to shut down the power supply for the memory cell 1 that is connected to the pair of bit lines BIT and NBIT. When the power supply for the memory cell 1 is shut down, the control signal FLTCNT has its voltage level set to be such a level as to turn OFF the transistors Tp3A and Tp3B. Likewise, the layout shown in the FIG. 5B is basically the same as that shown in the FIG. 4B, except that the power supply line through which the VSS potential is supplied is replaced in the p-type region with a line through which the control signal FLTCNT is applied.

In the configuration of FIGS. 5A and 5B, the transistors Tp3A and Tp3B, which are provided to reduce the influence of the coupling capacitance between the gate and drain of the fin transistor, also have the function of electrically isolating a portion of the sense amplifier circuit 20 in p-type region from the pair of sense lines SL and NSL. This eliminates the need for separately providing a transistor for shutting down a power supply for the purpose of carrying out electric isolation in the p-type region, and consequently, allows for reducing an increase in the circuit area. Note that the dummy transistors Tp3A and Tp3B may be controlled by means of the control signal FLTCNT for any other purpose.

Figure 6A:
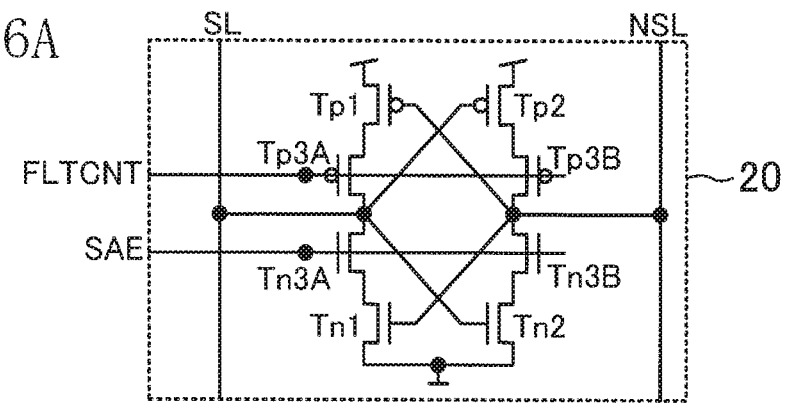
Figure 6B:
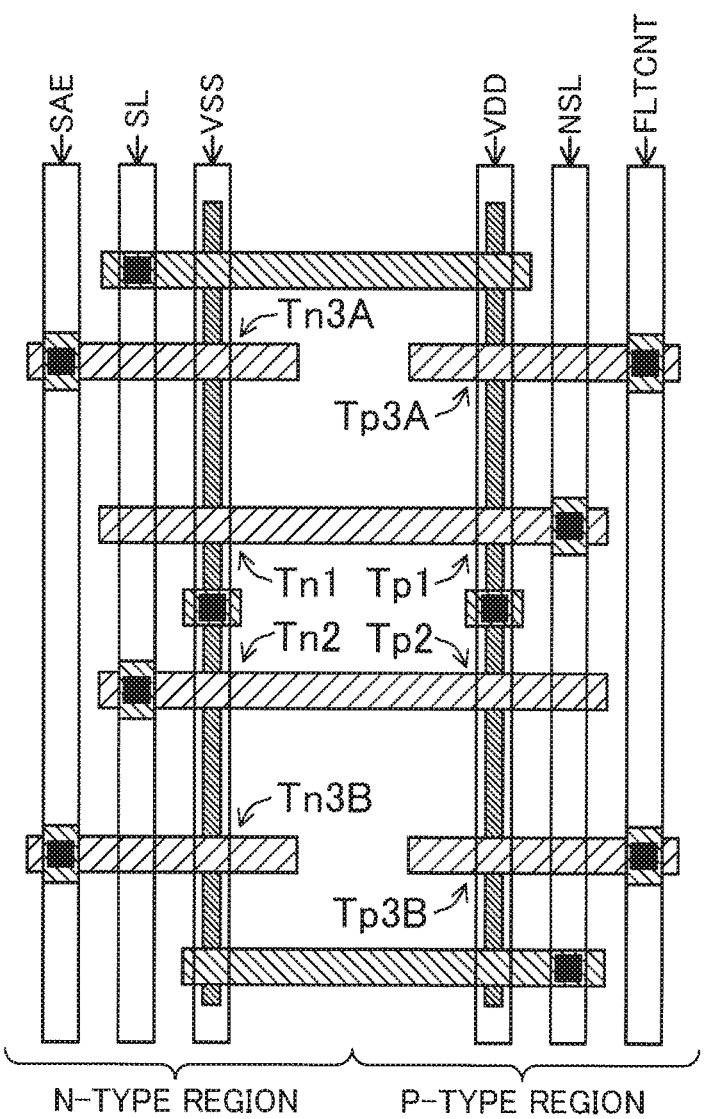
Figure 7:
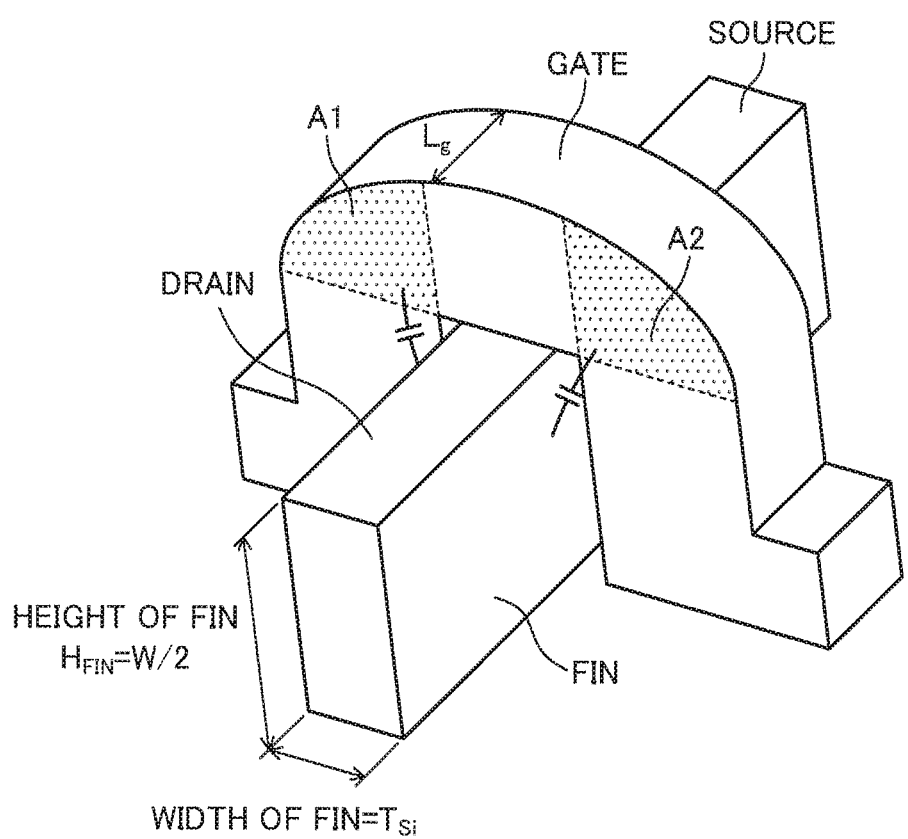
FIG. 7 is a schematic diagram showing a transistor with a fin structure.

FIGS. 6A and 6B show yet another exemplary sense amplifier circuit 20 according to this embodiment. Specifically, FIG. 6A is a circuit diagram, and FIG. 6B is a plan view illustrating a layout design thereof. The configuration of the p-type region of FIG. 6 is the same as, or similar to, that of FIG. 5, whereas the circuit configuration and layout design of the n-type region of FIG. 6 are different from those of FIG. 5. Specifically, the transistor Tn1 functioning as a fifth transistor has its source connected to the VSS and its gate connected to the sense line NSL. The transistor Tn2 functioning as a sixth transistor has its source connected to the VSS and its gate connected to the sense line SL. The transistor Tn3A functioning as a seventh transistor has its source connected to the drain of the transistor Tn1 and its drain connected to the sense line SL. The transistor Tn3B functioning as an eighth transistor has its source connected to the drain of the transistor Tn2 and its drain connected to the sense line NSL. A sense amplifier enable signal SAE is applied to the gates of the transistors Tn3A and Tn3B. This sense amplifier enable signal SAE serves as a control signal which switches the transistors Tn3A and Tn3B between the ON and OFF states.

A comparison between the configuration of FIGS. 5A and 5B and the configuration of FIGS. 6A and 6B reveals that the transistor Tn3 is omitted from the configuration of FIGS. 6A and 6B, and instead of this transistor Tn3, the transistor Tn3A is connected in series between the transistor Tn1 and the sense line SL, and the transistor Tn3B is connected in series between the transistor Tn2 and the sense line NSL. That is to say, the circuit configuration of FIG. 6A has neither the structure in which the gate and drain of a single p-channel transistor are connected to the sense lines SL and NSL nor the structure in which the gate and drain of a single n-channel transistor are connected to the sense lines SL and NSL. This allows for preventing more reliably the coupling capacitance between the gate and drain of the fin transistor from affecting the pair of sense lines SL and NSL, thereby reducing even more significantly the occurrence of data read and write errors.

In addition, since the gates do not have to be folded in the layout design as shown in FIG. 6B, the regularity of the layout is improved, which increases the reliability of the semiconductor storage device.

In the above embodiment, an SRAM has been described as an exemplary semiconductor storage device according to the present disclosure. However, the present disclosure is also applicable to a semiconductor storage device with any other configuration, such as a DRAM.

According to the present disclosure, the influence of a coupling capacitance is reduced in a semiconductor storage device including a fin transistor. The present disclosure is therefore useful for improvement of the performance of such a semiconductor storage device.

What is claimed is:

1. A semiconductor storage device comprising:
a bit line pair comprised of a first bit line and a second bit line; and
a cross-coupled circuit provided between the first bit line and the second bit line, wherein
the cross-coupled circuit includes first, second, third, and fourth transistors configured as fin transistors of p-channel type,
the first transistor has a source connected to a first power supply and a gate connected to the second bit line,
the second transistor has a source connected to the first power supply and a gate connected to the first bit line,
the third transistor has a source connected to the first transistor's drain and a drain connected to the first bit line, and
the fourth transistor has a source connected to the second transistor's drain and a drain connected to the second bit line.

2. The semiconductor storage device of claim 1, wherein the third and fourth transistors have gates electrically connected to a second power supply which has a lower supply voltage than the first power supply.

3. The semiconductor storage device of claim 1, wherein a control signal which switches the third and fourth transistors between ON and OFF states is applied to the third transistor's gate and the fourth transistor's gate.

4. The semiconductor storage device of claim 3, wherein the control signal is applied in response to a signal to shut down a power supply for a memory cell which is connected to the bit line pair, and
when the power supply for the memory cell is shut down, the control signal has its voltage level set to be such a level as to turn OFF the third and fourth transistors.

5. The semiconductor storage device of claim 1, wherein the cross-coupled circuit includes first, second, third, and fourth gates each extending in a first direction and arranged in parallel with each other,
each of the first to fourth transistors includes an associated one of the first to fourth gates and a fin, and
the first to fourth gates are arranged in a second direction, which is perpendicular to the first direction, in the order of the third gate, the first gate, the second gate, and the fourth gate.

6. The semiconductor storage device of claim 5, wherein in the cross-coupled circuit, a power supply line of the first power supply is arranged to extend in the second direction, and the first and second bit lines are arranged to extend in the second direction such that the power supply line is interposed between the first and second bit lines.

7. A sense amplifier circuit provided between a first sense line and a second sense line which form a sense line pair, the sense amplifier circuit comprising:
first, second, third, and fourth transistors which are configured as fin transistors of p-channel type, wherein
the first transistor has a source connected to a first power supply and a gate connected to the second sense line;
the second transistor has a source connected to the first power supply and a gate connected to the first sense line,
the third transistor has a source connected to the first transistor's drain and a drain connected to the first sense line, and
the fourth transistor has a source connected to the second transistor's drain and a drain connected to the second sense line.

8. The sense amplifier circuit of claim 7, wherein
the third and fourth transistors have gates electrically connected to a second power supply which has a lower supply voltage than the first power supply.

9. The sense amplifier circuit of claim 7, wherein
a control signal which switches the third and fourth transistors between ON and OFF states is applied to the third transistor's gate and the fourth transistor's gate.

10. The sense amplifier circuit of claim 9, wherein
the control signal is applied in response to a signal to shut down a power supply for a memory cell which is connected to the sense line pair, and
when the power supply for the memory cell is shut down, the control signal has its voltage level set to be such a level as to turn OFF the third and fourth transistors.

11. The sense amplifier circuit of claim 7, further comprising:
first, second, third, and fourth gates each extending in a first direction and arranged in parallel with each other, wherein
each of the first to fourth transistors includes an associated one of the first to fourth gates and a fin, and
the first to fourth gates are arranged in a second direction, which is perpendicular to the first direction, in the order of the third gate, the first gate, the second gate, and the fourth gate.

12. The sense amplifier circuit of claim 7, further comprising:
fifth, sixth, and seventh transistors configured as fin transistors of n-channel type, wherein
the fifth transistor has a drain connected to the first sense line and a gate connected to the second sense line,
the sixth transistor has a drain connected to the second sense line and a gate connected to the first sense line, and
the seventh transistor has a drain connected to the fifth transistor's source and the sixth transistor's source, and a source connected to a second power supply which has a lower supply voltage than the first power supply.

13. The sense amplifier circuit of claim 12, wherein
a control signal which switches the seventh transistor between ON and OFF states is applied to the seventh transistor's gate.

14. The sense amplifier circuit of claim 7, further comprising:
fifth, sixth, seventh, and eighth transistors configured as fin transistors of n-channel type, wherein
the fifth transistor has a source connected to a second power supply which has a lower supply voltage than the first power supply and a gate connected to the second sense line,
the sixth transistor has a source connected to the second power supply and a gate connected to the first sense line,
the seventh transistor has a source connected to the fifth transistor's drain and a drain connected to the first sense line, and
the eighth transistor has a source connected to the sixth transistor's drain and a drain connected to the second sense line.

15. The sense amplifier circuit of claim 14, wherein
a control signal which switches the seventh and eighth transistors between ON and OFF states is applied to the seventh transistor's gate and the eighth transistor's gate.

16. A semiconductor storage device including the sense amplifier circuit of claim 7.

* * * * *